(12) United States Patent
Luning

(10) Patent No.: US 6,294,433 B1
(45) Date of Patent: Sep. 25, 2001

(54) GATE RE-MASKING FOR DEEPER SOURCE/DRAIN CO-IMPLANTATION PROCESSES

(75) Inventor: Scott D. Luning, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/501,560

(22) Filed: Feb. 9, 2000

(51) Int. Cl.7 .................................................. H01L 21/336
(52) U.S. Cl. ................................................ 438/301; 438/514
(58) Field of Search .................................. 438/194, 195, 438/196, 197, 225, 267, 270, 301, 300, 303, 305, 306, 297, 298, 299, 439, 509, 510, 514, 289, 290, 291, 659, 660, 680, 693, 914

(56) References Cited

U.S. PATENT DOCUMENTS

| | | | |
|---|---|---|---|
| 5,112,761 | * 5/1992 | Matthews | 438/207 |
| 5,656,519 | * 8/1997 | Mogami | 438/303 |
| 5,698,869 | * 12/1997 | Yoshimi et al. | 257/192 |
| 6,114,736 | * 9/2000 | Balasubramanyam et al. | 257/412 |

* cited by examiner

Primary Examiner—David Nelms
Assistant Examiner—David Nhu
(74) Attorney, Agent, or Firm—Williams, Morgan & Amerson, P.C.

(57) ABSTRACT

The present invention is directed to a method of forming source/drain regions in a semiconductor device and a novel device structure. In one illustrative embodiment, the method involves forming a gate stack comprised of a gate electrode above a semiconducting substrate, and performing first and second ion implantation processes to form first and second doped regions in said substrate. The method continues with forming a masking layer above at least the gate electrode, performing a third ion implantation process after the masking layer is formed to create a third doped region in the substrate, and annealing the doped regions. In one illustrative embodiment, a semiconductor device includes a gate stack formed above a substrate, and a plurality of source/drain regions formed in the substrate, the source/drain regions having a junction depth that ranges from approximately 2000–2500 Å.

25 Claims, 4 Drawing Sheets

GATE RE-MASKING FOR DEEPER SOURCE/DRAIN CO-IMPLANTATION PROCESSES

BACKGROUND OF THE INVENTION

1. Field of the Invention

The present invention is generally directed to the field of semiconductor processing, and, more particularly, to a method of forming source/drain regions in a semiconductor device.

2. Description of the Related Art

There is a constant drive within the semiconductor industry to increase overall performance and operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the transistor, the faster the transistor will operate. Thus, there is a constant drive to reduce the size, or scale, of the components of a typical transistor to increase device performance and the overall speed of the transistor, as well as integrated circuit devices incorporating such transistors.

With this continual drive to increase transistor performance, all aspects of device operation must be examined for purposes of enhancing device performance. For example, leakage currents that may occur whenever a semiconductor device, e.g., a transistor, is "on" or "off", must be reduced One factor that tends to increase these leakage currents is having source/drain junctions of an insufficient depth. Typically, a contact comprised of a metal silicide, e.g., cobalt silicide, is formed above a source/drain region to facilitate the electrical connection of a conductive line to the source/drain region, ie., the metal silicide region is used to reduce the contact resistance and the sheet resistance of the contacted layer. If the depth of the source/drain junction, which is generally understood to be at a point at which the concentration of N-dopant atoms and P-type dopant atoms are approximately equal, is not deep enough, then there may be leakage currents when the device is either "on" or "off." Thus, in general, it is desirable to form source/drain regions in which the junction depth is deeper rather than shallower.

In general, source/drain regions may be formed by a variety of techniques. For example, source/drain regions may be formed by performing multiple ion implantation processes in which various dopant atoms are implanted into a semiconducting substrate. An initial ion implantation process may be performed to form relatively shallow, extension implants in the substrate. Thereafter, a traditional source/drain implant may be performed at a relatively heavy dopant concentration, but deeper and/or of higher concentration than the initial extension implants. Thereafter, another implant process, typically referred to as a co-implant process, may be performed in an effort to achieve greater junction depths. However, even using these co-implant processes with traditional process flows, junction depths of the source/drain regions may be limited to about 1700–1800 Å.

Another problem associated with source/drain regions is capacitance. In general, it is desirable to reduce the capacitance caused by the source/drain regions to enhance device performance. Reducing this capacitance is important because this capacitance must be charged and discharged every operating cycle in which the transistor is turned "on" or "off." This results in RC time delays with respect to signal propagation throughout the device, as well as an increase in the power consumed by the device during operation. In general, it is desirable to have source/drain regions with a more gradual dopant concentration profile to reduce the capacitance of the source/drain regions.

The present invention is directed to a method that solves or at least reduces some or all of the aforementioned problems.

SUMMARY OF THE INVENTION

The present invention is directed to a method of forming source/drain regions in a semiconductor device, and a semiconductor device having such source/drain regions. In one illustrative embodiment, the method comprises forming a gate electrode above a semiconducting substrate, forming a masking layer at least above the gate electrode, and performing multiple ion implantation processes to form a source/drain region in the substrate, at least one of the ion implantation processes being performed after the masking layer is formed above the gate electrode.

In one embodiment, the semiconductor device is comprised of a semiconducting substrate that has a surface, a gate dielectric positioned above the surface of the substrate, a gate electrode positioned above the gate dielectric, and a source/drain region defining a junction depth that is at least 2000 Å beneath the surface of the substrate.

BRIEF DESCRIPTION OF THE DRAWINGS

The invention may be understood by reference to the following description taken in conjunction with the accompanying drawings, in which like reference numerals identify like elements, and in which.

Figure 1:
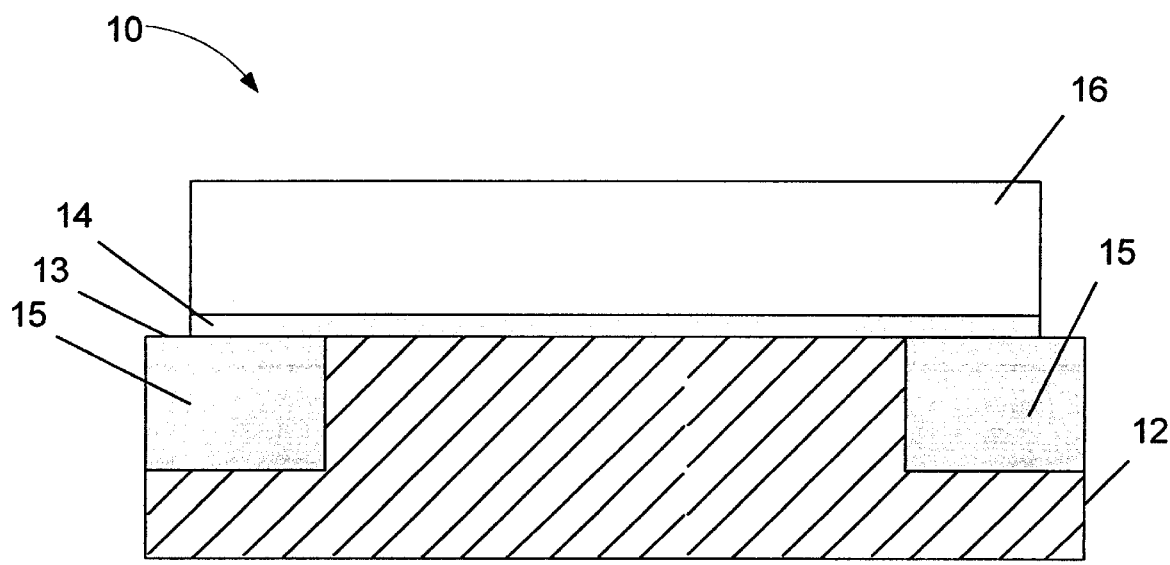
FIG. 1 is a cross-sectional view of a partially formed semiconductor device.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–8. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to the process of forming source/drain regions in a semiconductor device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

A partially formed semiconductor device 10 is depicted in FIG. 1. The semiconductor device 10 is comprised of a gate dielectric layer 14 formed above a surface 13 of a semiconducting substrate 12, and a gate electrode layer 16 formed above the gate dielectric layer 14. Shallow trench isolations 15 comprised of, for example, silicon dioxide, are also formed in the substrate 12 using known techniques. The semiconducting substrate 12 may be comprised of a variety of materials, such as silicon with a layer of epitaxial silicon (not shown) formed thereabove, e g., a p-type epitaxial layer formed over p-doped bulk silicon.

The materials comprising the gate dielectric layer 14 and the gate electrode layer 16 may be varied as a matter of design choice. For example, the gate electrode layer 14 may be comprised of silicon dioxide or a nitrogen bearing oxide, and the gate electrode layer 16 may be comprised of polycrystalline silicon (polysilicon). Dopant atoms may also be added to the gate electrode by, for example, an ion implantation process, to reduce the sheet resistance of the gate electrode. Moreover, these layers may be formed by a variety of known techniques for forming such layers, such as thermal growth, chemical vapor deposition ("CVD"), physical vapor deposition ("PVD"), plasma enhanced chemical vapor deposition ("PECVD"), sputtering, etc. Thus, the particular materials of construction, as well as the manner of making the gate dielectric layer 14 and the gate electrode layer 16, should not be considered a limitation of the present invention unless specifically recited in the appended claims. In one illustrative embodiment, the gate dielectric layer 14 is comprised of a thermally grown layer of silicon dioxide having a thickness ranging from approximately 15–30 Å, and the gate electrode layer 16 is comprised of approximately 1000–2000 Å of polysilicon that is formed by a deposition process.

Figure 2:
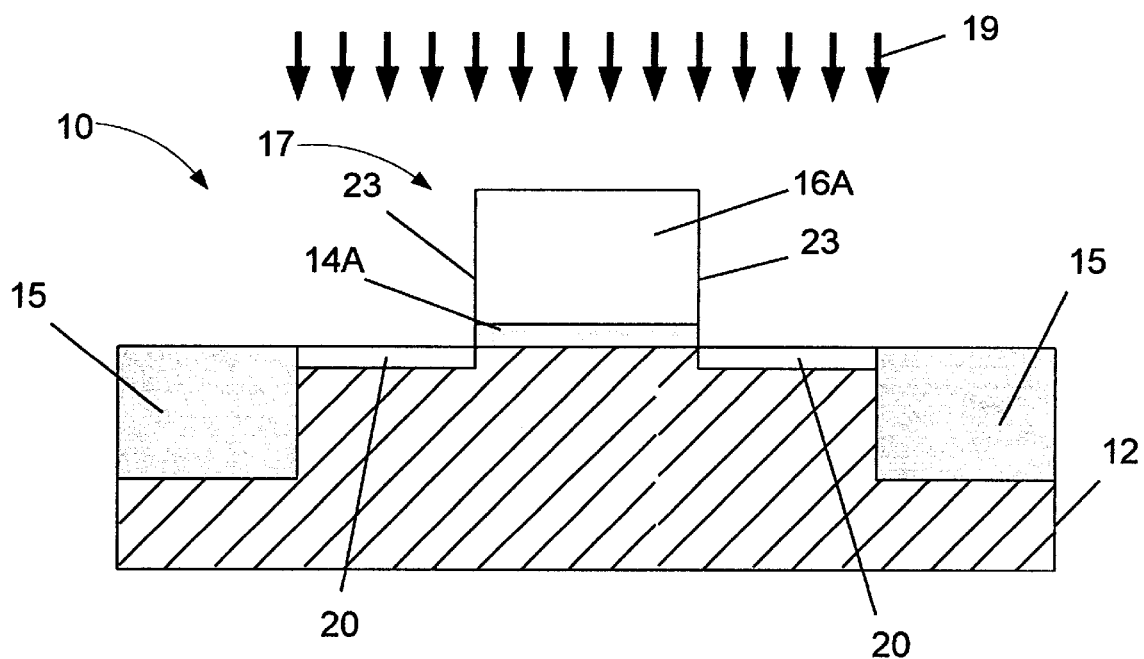
FIG. 2 is the device of FIG. 1 after a patterning operation has been performed to define a gate stack above a semiconducting substrate and an implantation process has been performed to define a doped region in the substrate.

Next, as shown in FIG. 2, the gate electrode layer 16 and gate dielectric layer 14 are patterned to define a gate stack 17 comprised of a gate electrode 16A and a gate dielectric 14A. This patterning may be accomplished by performing one or more etching processes, such as an anisotropic reactive ion etching process. Note, however, that it is not required that both the gate dielectric layer 14 and the gate electrode layer 16 be patterned at the same time. That is, the gate stack 17 may be comprised of only the patterned gate electrode layer 16 for all or a substantial portion of the processing operations described herein.

Thereafter, as indicated by arrows 19, an ion implantation process is performed to form self-aligned doped regions 20 in the substrate 12 for the illustrative NMOS device. The doped regions 20 may have a depth or thickness ranging from approximately 300–700 Å. The dopant atoms to be added by the implantation process 19 may vary depending upon the particular device under construction. For example, in the case of the illustrative NMOS device depicted in FIG. 2, the dopant atoms may be comprised of arsenic or phosphorous. For PMOS devices, the dopant materials may be comprised of boron, etc. The concentration of the dopant atoms as well as the implant energy for the implantation process may be varied as a matter of design choice. For example, the concentration or dose of dopant atoms may range from approximately $1 \times 10^{14}$–$1 \times 10^{15}$ ions/cm$^2$, and the energy level may vary between approximately 3–5 keV. In one illustrative implantation process for an NMOS device, the ion implantation process 19 is comprised of approximately $1 \times 10^{14}$–$1 \times 10^{15}$ ions/cm$^2$ of arsenic implanted at an energy ranging between approximately 3–5 keV. Note that a small sidewall spacer (not shown) may be formed adjacent the gate stack 17 prior to the formation of the doped region 20.

Figure 3:
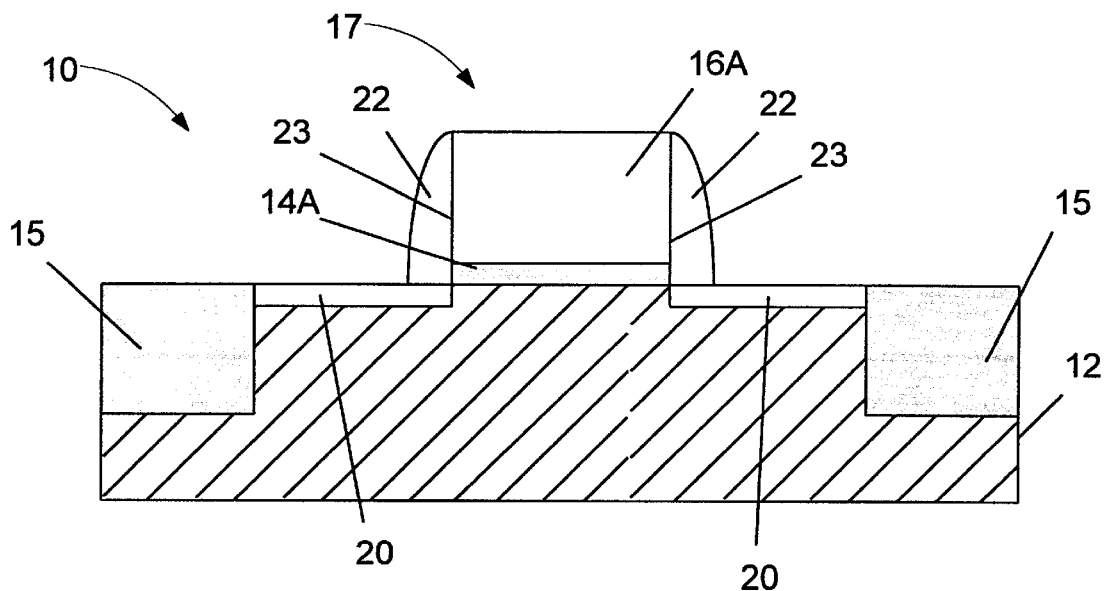
FIG. 3 is a cross-sectional view of the device shown in FIG. 2 after sidewall spacers have been formed adjacent the gate stack.

Next, as shown in FIG. 3, a plurality of sidewall spacers 22 are formed adjacent the sides 23 of the gate stack 17 and the gate electrode 16A. The sidewall spacers 22 may be constructed by forming an appropriate layer of spacer material, e.g., silicon dioxide, silicon oxynitride, etc., above the device depicted in FIG. 3, and, thereafter, performing an anisotropic etching process to result in the sidewall spacers 22. Please note that, although single sidewall spacers 22 are depicted in FIG. 3, multiple sidewall spacers could be formed adjacent each of the sides 23 of the gate stack 17, i.e., one spacer could be formed on the side 23 of the gate stack and an additional spacer could be formed adjacent the previously formed spacer.

Figure 4:
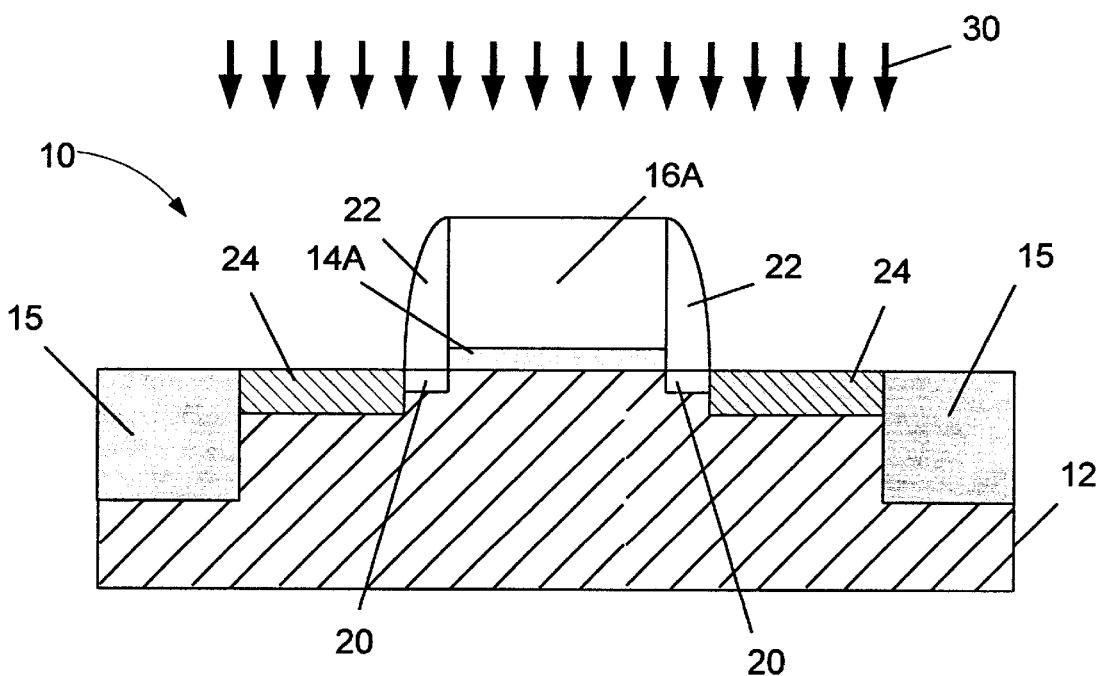
FIG. 4 is a cross-sectional view of the device shown in FIG. 3 after another doped region has been formed in the substrate adjacent the sidewall spacers.

Thereafter, as shown in FIG. 4, an implantation process 30 is performed to implant dopant atoms into the substrate 12, thereby forming doped regions 24. The doped regions 24 may have a depth or thickness ranging from approximately 1000–1500 Å. The particular dopant atoms selected as well as the concentration of the atoms may be varied as a matter of design choice, depending upon the particular technology involved. For example, the concentration of the dopant atoms may range from $1-3 \times 10^{15}$ ions/cm$^2$, and the implant energy level may range from approximately 5–30 keV. In one illustrative embodiment, in the case of an illustrative NMOS device, the ion implantation process 30 may be comprised of implanting approximately $3 \times 10^{15}$ ions/cm$^2$ of arsenic at an energy level ranging from approximately 20–30 keV.

Figure 5:
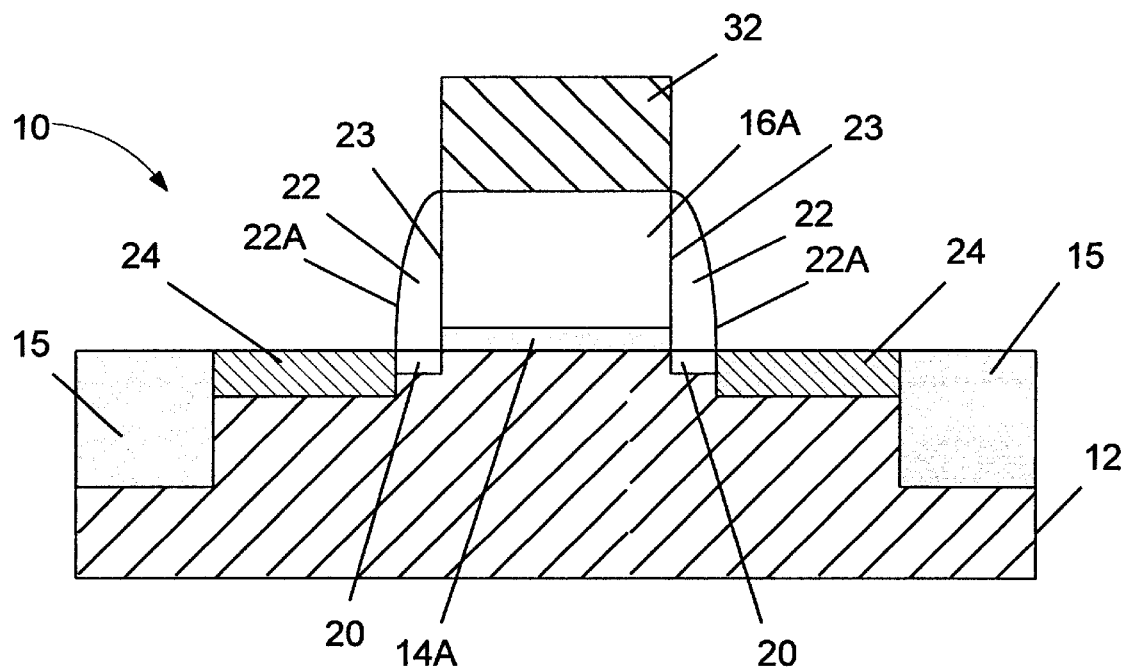
FIG. 5 is a cross-sectional view of the device shown in FIG. 4 after a masking layer has been formed above the gate electrode of the device using one illustrative technique.
Figure 6:
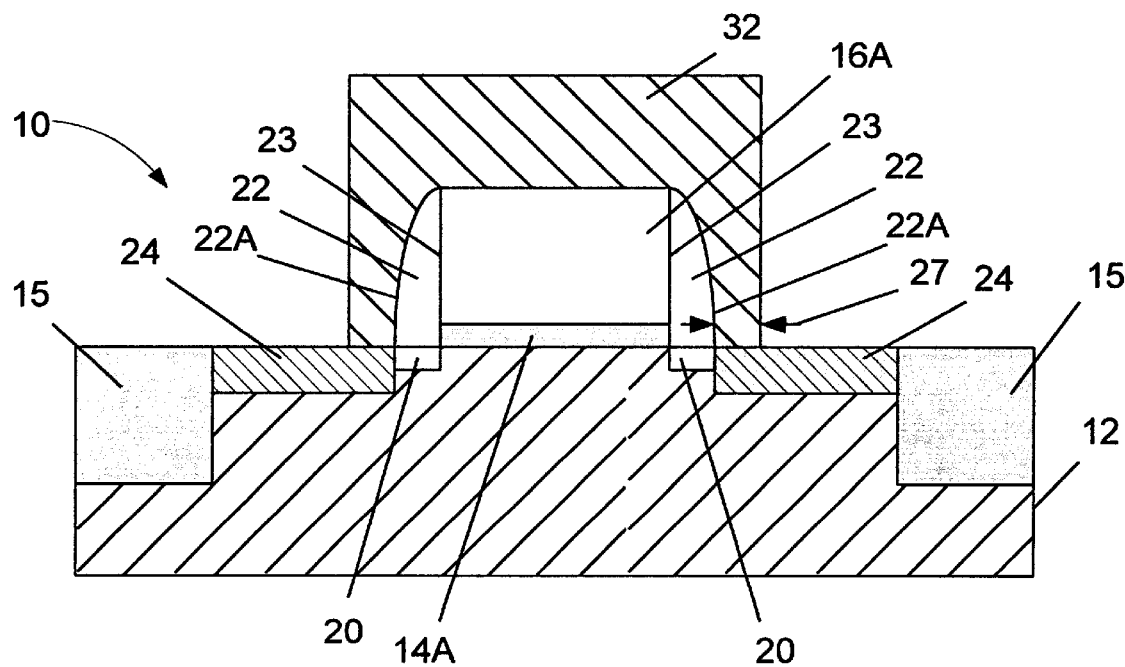
FIG. 6 depicts an alternative technique for forming a masking layer above the gate electrode of the device depicted in FIG. 4.

Next, as shown in FIGS. 5 and 6, a masking layer 32 is formed above the gate electrode 16A. FIGS. 5 and 6 depict two different techniques for accomplishing this objective. The masking layer 32 may be comprised of any material that is capable of limiting or reducing the penetration of dopant atoms into or through the gate electrode 16A during a subsequent ion implantation process to be described more fully below. For example, the masking layer 32 may be comprised of approximately 5000 Å of photoresist that is formed and patterned using traditional photolithography techniques.

In the embodiment depicted in FIG. 6, the masking layer 32 is patterned such that it covers the gate stack 17 and extends beyond the sides 22A of the sidewall spacers 22 by an amount indicated by arrows 27. In general, the dimension indicated by arrows 27 should be relatively small. In this technique, the masking layer 32 is made wider than the gate electrode 16A to provide more tolerance with respect to aligning the masking layer 32 over the gate electrode 16A. Of course, the width of the masking layer 32 need not be as wide as depicted in FIG. 6. That is, the masking layer 32 may be formed so that it extends slightly beyond the sides 23 of the gate stack 17 and not beyond the sidewall spacers 22. In fact, to the extent possible, it is desirable for the doped regions 24 formed by the implantation process 30 to be self-aligned with respect to the sidewall spacers 22 (or the outermost spacer in the case of multiple spacers).

Figure 7:
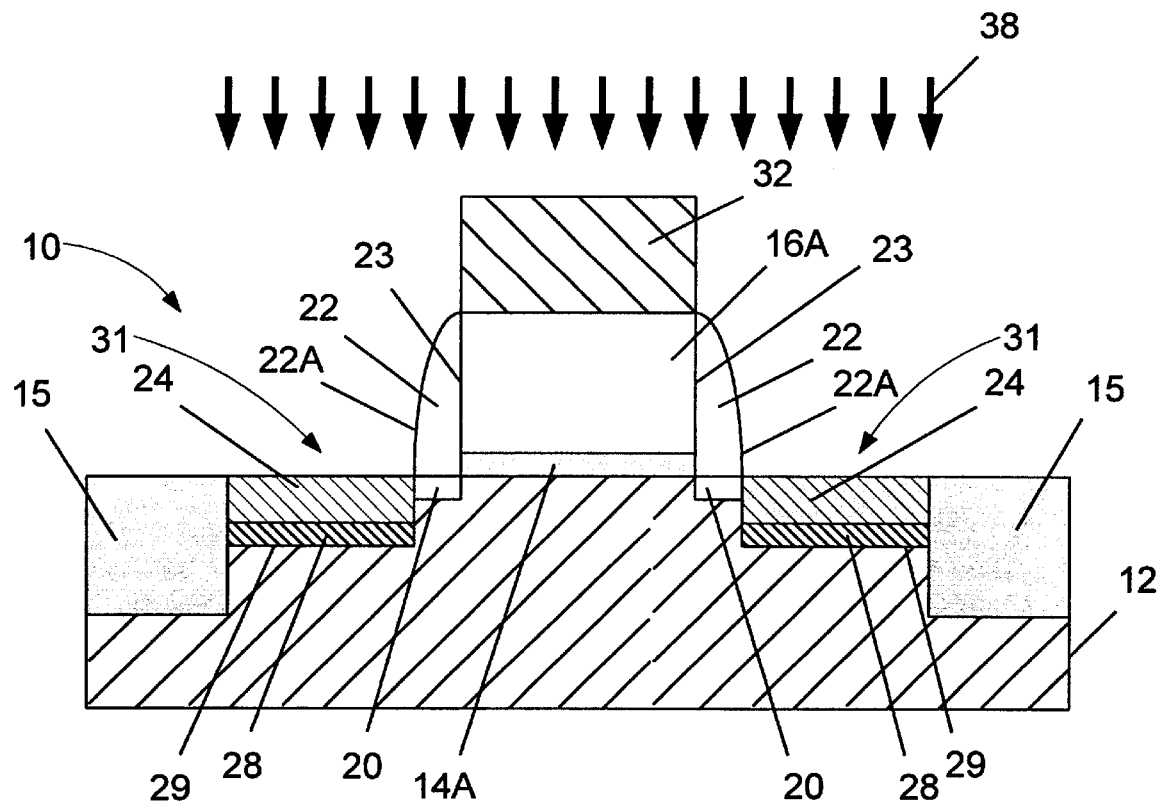
FIG. 7 is a cross-sectional view of the device shown in FIG. 5 after another ion implantation process has been performed on the device.

Thereafter, as shown in FIG. 7, another ion implantation process 38 is performed on the device depicted in FIG. 5 to form doped regions 28 in the substrate 12. Of course, this same process could be performed on the device depicted in FIG. 6 with the alternative embodiment of the masking layer 32. As with the other ion implantation processes, the dopant material, concentration, and energy levels of the implantation process may be varied as a matter of design choice. For example, the dopant concentration may range between approximately $1 \times 10^{13} - 1 \times 10^{14}$ ions/cm$^2$ at an energy level ranging from approximately 60–300 keV. In one illustrative embodiment, the ion implantation process 38 for an NMOS device is comprised of approximately $3-5 \times 10^{13}$ ions/cm$^2$ of arsenic implanted at an energy level of approximately 60–200 keV. This results in source/drain regions 31 comprised of doped region 24, doped region 28, and doped region 20, as indicated in FIG. 7.

During the ion implantation process 38, the masking layer 32 acts to reduce or prevent dopant atoms from penetrating through the gate electrode 16A and the gate dielectric 14A and into the channel region 33 of the device 10. Through use of the masking layer 32, the doped regions 28 can be formed deeper in the substrate 12. For example, the doped regions 28 may define a junction depth 29 that is 2000 Å or greater beneath the surface 13 of the substrate 12. Of course, care should be taken in forming the doped regions 24 and the doped regions 28 to insure that there is some overlap between the two regions, i.e., to insure that a single source/drain region 31 is formed.

Thereafter, a heat treatment or anneal process is performed to activate the dopant atoms in the various doped regions 20, 28 and 24, and to repair any damage to the silicon lattice structure due to the various ion implantation processes describe above. The masking layer 32 may or may not have been removed at this point, depending upon, among other things, whether it can withstand the temperature of the anneal process. After this anneal process is performed, the dopant atoms in the doped regions 20, 28 and 24 will be driven or moved. The resulting source/drain regions 31 and the overall structure is approximately illustrated in FIG. 8.

For example, the anneal process results in some of the doped region 20 being driven slightly under the side 23 of the gate stack 17. Additionally, some portion of the doped region 24 may be driven under the sidewall spacers 22. Of course, the dopant atoms in the various doped regions may also be driven further into the substrate. This heat treatment may be performed by a variety of techniques, e.g., a rapid thermal anneal process, etc. In one illustrative embodiment, the heat treatment is comprised of performing a rapid thermal anneal (SRTAX) process at a temperature ranging from approximately 900–1200° C. for a duration ranging from approximately 10–30 seconds. Of course, multiple anneal steps may be performed at various stages of the fabrication process in lieu of performing the single RTA process described above. After the doped regions are annealed, the junction depth 29 of the source/drain region 31 may be between approximately 2000–2500 Å beneath the surface 13 of the substrate 12.

Figure 8:
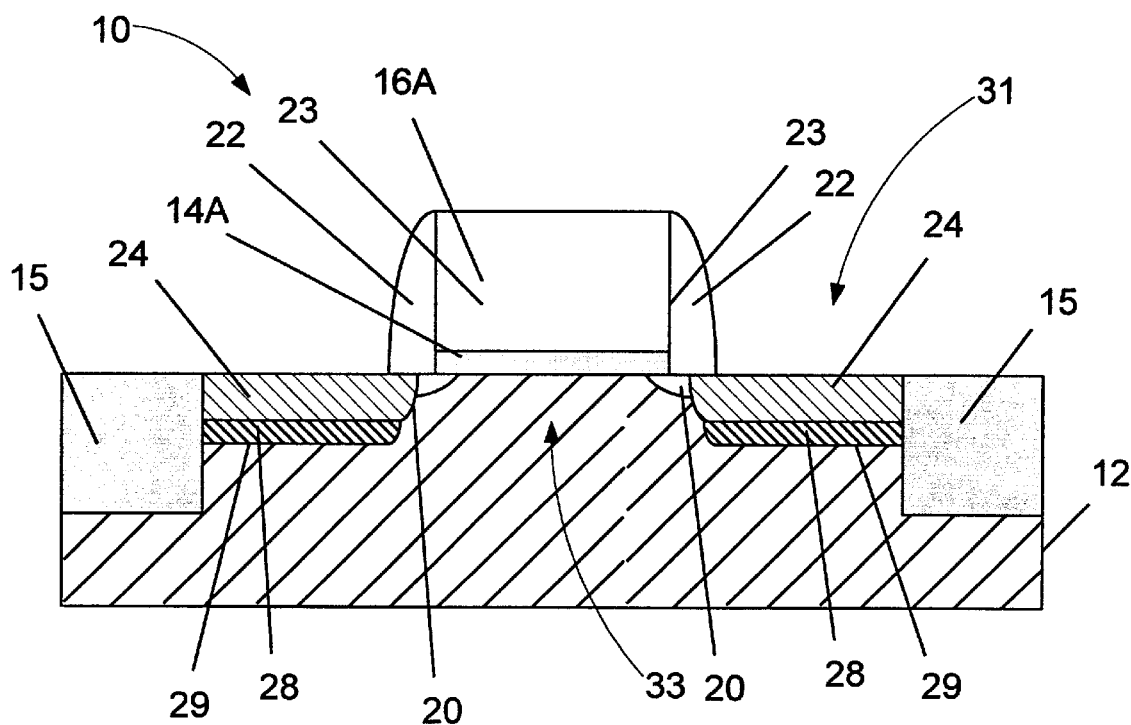
FIG. 8 is a cross-sectional view of the device shown in FIG. 7 after an anneal process has been performed.

Next, although not depicted in the attached drawings, traditional salicidation processing may be performed to form metal silicide regions above the device depicted in FIG. 8. More particularly, a layer of refractory metal (not shown), comprised of a variety of refractory metals, such as cobalt, titanium, etc., may be formed above the device depicted in FIG. 8 by a variety of techniques, e.g., deposition. In one illustrative embodiment, the refractory metal layer may be comprised of approximately 150 Å of cobalt that is formed by a deposition process. Thereafter, using traditional salicidation processing, portions of the refractory metal layer are converted to metal silicide regions (not shown) formed on the source/drain regions 31 and a metal silicide region (not shown) formed on the gate electrode 16A. The metal silicide regions provide better electrical contact to the source/drain regions 33 and gate electrode 16A and reduce the sheet resistance of those regions.

As described above, in one illustrative embodiment, the method disclosed herein is comprised of forming a gate electrode 16A above the substrate 12, forming a masking layer 32 (comprised of, for example, photoresist) above at least the gate electrode 16A, and performing multiple ion implantation processes to form source/drain regions 31 in the substrate 12, at least one of the ion implantation processes being performed after the masking layer 32 is formed above the gate electrode 16A. In yet a more specific embodiment of the present invention, the ion implantation process that is performed after the masking layer 32 is formed may have a dopant concentration and energy level similar to that described above for the ion implantation process indicated by arrows 38 in FIG. 7.

Through use of the present invention, semiconductor devices may be manufactured with deeper junction depths, thereby tending to eliminate or at least reduce leakage currents in the device. Moreover, through use of the present invention, source/drain capacitance may be reduced due to the ability to manufacture a device having source/drain regions with a more gradual dopant concentration gradient as compared to prior art devices. Thus, the present invention may be used to manufacture semiconductor devices that may exhibit improved performance characteristics.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a gate electrode above a semiconducting substrate;
   performing at least one ion implantation process to form at least one doped region in said substrate;
   forming a masking layer at least above said gate electrode after said at least one ion implantation step is performed; and
   performing at least one additional ion implantation process after said masking layer is formed at least above said gate electrode to form at least one additional doped region in said substrate.

2. The method of claim 1, wherein forming a gate electrode above a semiconducting substrate comprises forming a gate electrode comprised of polysilicon above a semiconducting substrate.

3. The method of claim 1, wherein forming a masking layer above at least said gate electrode comprises forming a masking layer comprised of photoresist above at least said gate electrode.

4. The method of claim 1, further comprising forming sidewall spacers adjacent said gate electrode, and said masking layer is formed above at least said gate electrode and said sidewall spacers.

5. The method of claim 1, wherein performing at least one additional ion implantation process after said masking layer is formed at least above said gate electrode, comprises performing an ion implantation process after said masking layer is formed at least above said gate electrode at a dopant concentration ranging from approximately $1\times10^{13}$–$1\times10^{14}$ ions/cm$^2$ and at an energy level ranging from approximately 60–300 keV.

6. The method of claim 1, wherein performing at least one ion implantation process to form at least one additional doped region in said substrate, comprises:
   performing a first ion implantation process at a dopant concentration ranging from approximately $1\times10^{14}$–$1\times10^{15}$ ions/cm$^2$ and at an energy level ranging from approximately 3–5 keV;
   performing a second ion implantation process at a dopant concentration ranging from approximately $1$–$5\times10^{15}$ ions/cm$^2$ and at an energy level ranging from approximately 5–30 keV; and wherein performing at least one additional ion implantation process after said masking layer is formed comprises:
      performing a third ion implantation process after said masking layer is formed at a dopant concentration ranging from approximately $1\times10^{13}$–$1\times10^{14}$ ions/cm$^2$ and at an energy level ranging from approximately 60–300 keV after said masking layer is formed.

7. A method, comprising:
   forming a gate stack comprised of a gate electrode above a semiconducting substrate, said gate stack having a plurality of sidewalls;
   performing a first ion implantation process to form a first doped region in said substrate;
   forming at least one sidewall spacer adjacent said sidewalls of said gate stack;
   performing a second ion implantation process in said substrate;
   forming a masking layer above at least said gate electrode after said second ion implantation process is performed;
   performing a third ion implantation process after said masking layer is formed to form a third doped region in said substrate; and
   annealing said first, second and third doped regions.

8. The method of claim 7, wherein forming a gate stack comprised of a gate electrode above a semiconducting substrate, said gate stack having a plurality of sidewalls, comprises forming a gate stack comprised of a polysilicon gate electrode above a semiconducting substrate, said gate stack having a plurality of sidewalls.

9. The method of claim 7, wherein performing a first ion implantation process to form a first doped region in said substrate comprises performing a first ion implantation process at a dopant concentration ranging from approximately $1\times10^{14}$–$1\times10^{15}$ ions/cm$^2$ and at an energy level ranging from approximately 3–5 keV to form a first doped region in said substrate.

10. The method of claim 7, wherein forming at least one sidewall spacer adjacent said sidewalls of said gate stack comprises forming a layer of spacer material above said gate stack and said substrate, and performing at least one anisotropic etching process.

11. The method of claim 7, wherein performing a second ion implantation process to form a second doped region in said substrate comprises performing a second ion implantation process at a dopant concentration ranging from approximately $1$–$5\times10^{15}$ ions/cm$^2$ and at an energy level ranging from approximately 5–30 keV to form a second doped region in said substrate.

12. The method of claim 7, wherein forming a masking layer above at least said gate electrode comprises forming a masking layer comprised of photoresist above at least said gate electrode.

13. The method of claim 7, wherein forming a masking layer above at least said gate electrode comprises forming a masking layer above at least said gate electrode and said sidewall spacers.

14. The method of claim 7, wherein performing a third ion implantation process after said masking layer is formed to form a third doped region in said substrate comprises performing a third ion implantation process after said masking layer is formed at a dopant concentration ranging from approximately $1\times10^{13}$–$1\times10^{14}$ ions/cm$^2$ and at an energy level ranging from approximately 60–300 keV to form a third doped region in said substrate.

15. The method of claim 7, wherein annealing said first, second and third doped regions comprises performing one rapid thermal anneal process.

16. The method of claim 7, wherein annealing said first, second and third doped regions comprises performing multiple rapid thermal anneal processes.

17. The method of claim 7, wherein annealing said first, second and third doped regions comprises performing a rapid thermal anneal process at a temperature ranging from approximately 900–1200° C. for a duration ranging from approximately 10–30 seconds.

18. A method, comprising:
   forming a gate stack comprised of a gate electrode above a semiconducting substrate, said gate stack having a plurality of sidewalls;
   performing a first ion implantation process at a dopant concentration ranging from approximately $1\times10^{14}$–$1\times10^{15}$ ions/cm$^2$ and at an energy level ranging from approximately 3–5 keV to form a first doped region in said substrate;
   forming at least one sidewall spacer adjacent said sidewalls of said gate stack;

performing a second ion implantation process at a dopant concentration ranging from approximately $1–5\times10^{15}$ ions/cm$^2$ and at an energy level ranging from approximately 5–30 keV in said substrate;

forming a masking layer above at least said gate electrode after said second ion implantation process is performed;

performing a third ion implantation process after said masking layer is formed at a dopant concentration ranging from approximately $1\times10^{13}–1\times10^{14}$ ions/cm$^2$ and at an energy level ranging from approximately 60–300 keV to form a third doped region in said substrate; and annealing said first, second and third doped regions.

19. The method of claim 18, wherein forming a gate stack comprised of a gate electrode above a semiconducting substrate, said gate stack having a plurality of sidewalls, comprises forming a gate stack comprised of a polysilicon gate electrode above a semiconducting substrate, said gate stack having a plurality of sidewalls.

20. The method of claim 18, wherein forming at least one sidewall spacer adjacent said sidewalls of said gate stack comprises forming a layer of spacer material above said gate stack and said substrate, and performing at least one anisotropic etching process.

21. The method of claim 18, wherein forming a masking layer above at least said gate electrode comprises forming a masking layer comprised of photoresist above at least said gate electrode.

22. The method of claim 18, wherein forming a masking layer above at least said gate electrode comprises forming a masking layer above at least said gate electrode and said sidewall spacers.

23. The method of claim 18, wherein annealing said first, second and third doped regions comprises performing one rapid thermal anneal process.

24. The method of claim 18, wherein annealing said first, second and third doped regions comprises performing multiple rapid thermal anneal processes.

25. The method of claim 18, wherein annealing said first, second and third doped regions comprises performing a rapid thermal anneal process at a temperature ranging from approximately 900–1200° C. for a duration ranging from approximately 10–30 seconds.

* * * * *